US005883460A

United States Patent [19]

Sato et al.

[11] Patent Number: 5,883,460

[45] Date of Patent: Mar. 16, 1999

[54] SUPPORT UNIT FOR ULTRASONIC VIBRATION RESONATOR

[75] Inventors: Shigeru Sato; Ryoichi Ishii; Seiya Nakai, all of Fukuoka-ken, Japan

[73] Assignee: Ultex Corporation, Fukuoka-ken, Japan

[21] Appl. No.: 879,321

[22] Filed: Jun. 19, 1997

[30] Foreign Application Priority Data

Jun. 28, 1996 [JP] Japan .................................... 8-170103

[51] Int. Cl.[6] .................................................. H01L 41/053

[52] U.S. Cl. ............................................ 310/348; 310/323

[58] Field of Search .................................... 310/323, 328, 310/348

[56] References Cited

U.S. PATENT DOCUMENTS

| | | | |
|---|---|---|---|
| 1,930,905 | 10/1933 | Nicolson | 310/323 |
| 3,727,084 | 4/1973 | Epstein | 310/328 |
| 4,052,628 | 10/1977 | Hayer | 310/333 |
| 4,540,113 | 9/1985 | Shimazaki | 228/1.1 |
| 5,053,670 | 10/1991 | Kosugi | 310/328 |
| 5,110,403 | 5/1992 | Ehlert | 156/580.1 |
| 5,455,477 | 10/1995 | Sano et al. | 310/328 |
| 5,600,196 | 2/1997 | Tamai | 310/323 |

FOREIGN PATENT DOCUMENTS

| | | | |
|---|---|---|---|
| 0619147 | 10/1994 | European Pat. Off. | B06B 3/00 |
| 56 071396 | 6/1981 | Japan | H04R 1/00 |
| 60-213274 | 10/1985 | Japan | 310/328 |
| 2-84078 | 3/1990 | Japan | 310/348 |
| 3-40766 | 2/1991 | Japan | 310/333 |
| 3-235678 | 10/1991 | Japan | 310/348 |
| 7-33910 | 8/1995 | Japan | B06B 1/02 |
| 2219245 | 12/1989 | United Kingdom | B06B 3/00 |

*Primary Examiner*—Thomas M. Dougherty
*Attorney, Agent, or Firm*—Kanesaka & Takeuchi

[57] ABSTRACT

First and second boosters are attached to a holder in the following manner to prevent a portion between the first and second boosters from being curved. The outer side surface of a projecting portion on the outer peripheral surface of a second booster is pressed toward the inward of the holder by a stopper attached to the holder so that a stepped portion formed in the interior surface of the holder is pressed by the projecting portion through a bridge member and a projecting portion on the outer peripheral surface of the first booster.

9 Claims, 3 Drawing Sheets

SUPPORT UNIT FOR ULTRASONIC VIBRATION RESONATOR

BACKGROUND OF THE INVENTION

1. [Field of the Invention]

This invention relates to an unit for supporting an ultrasonic vibration resonator.

2. [Description of the Prior Art]

Japanese Utility Model Publication No. Hei 7-33910, for example, discloses an unit for supporting an ultrasonic vibration resonator in which a first coupling horn called booster and a second coupling horn also called booster are connected in series to an ultrasonic head which is a transducer installed in a cylindrical casing of an ultrasonic processing machine.

In this conventional resonator supporting unit, the first coupling horn is stored in the cylindrical casing and a flange constituting a support portion projecting outward from the second coupling horn is fixed in the cylindrical casing so that the flange which is a support portion projecting outward from the first coupling horn is in contact with the interior wall of the cylindrical casing as a holder. Therefore, when ultrasonic vibration from the ultrasonic head is transmitted to a processing tool attached to the second coupling horn attached to the second coupling horn through the first coupling horn and the second coupling horn and the exterior surface of the processing tool is pressed against a workpiece to machine the workpiece, a portion between the flange of the first coupling and the flange of the second coupling horn is curved with the flange of the second coupling horn fixed in the cylindrical casing as a center by force received by the processing tool from the workpiece which is perpendicular to an axial direction with the result that a loss of ultrasonic vibration energy transmitted from the ultrasonic head to the processing tool is increased by internal stress generated thereby and also the contact position of the processing tool with respect to the workpiece becomes inaccurate inevitably.

SUMMARY OF THE INVENTION

In view of this, it is an object of the present invention to provide an unit for supporting a resonator for ultrasonic vibration bonding which can improve support stiffness against force of a perpendicular direction received by the resonator at the time of processing, thereby making it possible to reduce a loss of ultrasonic vibration energy and improve reliability in quality.

According to a first aspect of the present invention, there is provided a support unit for an ultrasonic vibration resonator in which two boosters connected coaxially to a transducer are supported in a cylindrical holder, wherein a transducer storage chamber and a booster storage chamber having a larger diameter than that of the transducer storage chamber are continuously and coaxially formed from an interior side to one end side of the holder, and support portions of the two boosters are connected to each other in such a manner that they are sandwiched between a stepped portion formed between the transducer storage chamber and the booster storage chamber of the holder and a cylindrical member stored and inscribed in the booster storage chamber and between the cylindrical member and a stopper attached to the holder in an axial direction, respectively.

According to the constitution of this first aspect, since the cylindrical member is fitted in the booster storage chamber and the support portions of the two boosters are sandwiched in the axial direction, support stiffness against force in a perpendicular direction is improved to prevent the support portions of the two boosters from yielding the force in the perpendicular direction, thereby making it possible to reduce a loss of ultrasonic vibration energy and improve reliability in quality.

Even when the stopper is strongly fastened to attach the resonator to the holder, such inconvenience that a portion between the support portions of the two boosters is curved in such a manner that they approach each other can be prevented.

When the cylindrical member is composed of ring-shaped spacers fitted onto the support portions of the boosters coaxially and a cylindrical collar interposed between the support portions of the two boosters to receive the spacers coaxially, the contact area of the cylindrical member with the support portions is reduced, thereby making it possible to reduce a loss of ultrasonic vibration energy transmitted from the transducer to the boosters.

When each of the spacers is fixed to the support portion of the booster by forming a slit in the spacer and fastening a screw into one separated portion from the other separated portion of the spacer, the attachment structure of the spacer can be simplified.

According to a second aspect of the present invention, there is provided a support unit for an ultrasonic vibration resonator in which a resonator having two boosters connected to both sides of an ultrasonic horn coaxially is supported by a holder at both sides, wherein the boosters are each stored within opposing arms of the holder and support portions projecting outward from the boosters are sandwiched between stepped portions formed in interior portions of the arms and stoppers attached to the arms in an axial direction, respectively.

According to the constitution of this second aspect, since the support portions of the boosters connected to both sides of the ultrasonic horn are sandwiched between the opposing arms of the holder in the axial direction, support stiffness against force in a perpendicular direction is improved to prevent the support portions of the two boosters from yielding the force in the perpendicular direction, thereby making it possible to reduce a loss of ultrasonic vibration energy and improve reliability in quality.

Even when the stoppers are strongly fastened to attach the resonator to the holder, such inconvenience that a portion between the support portions of the two boosters is curved in such a manner that they approach each other can also be prevented.

The above and other objectives, features and advantages of the invention will become more apparent from the following description when taken in conjunction with the accompanying drawings.

BRIEF DESCRIPTION OF THE ACCOMPANYING DRAWINGS

FIGS. 1 show a first embodiment of the present invention, wherein

DETAILED DESCRIPTION OF THE PREFERRED EMBODIMENTS

Figure 1A:
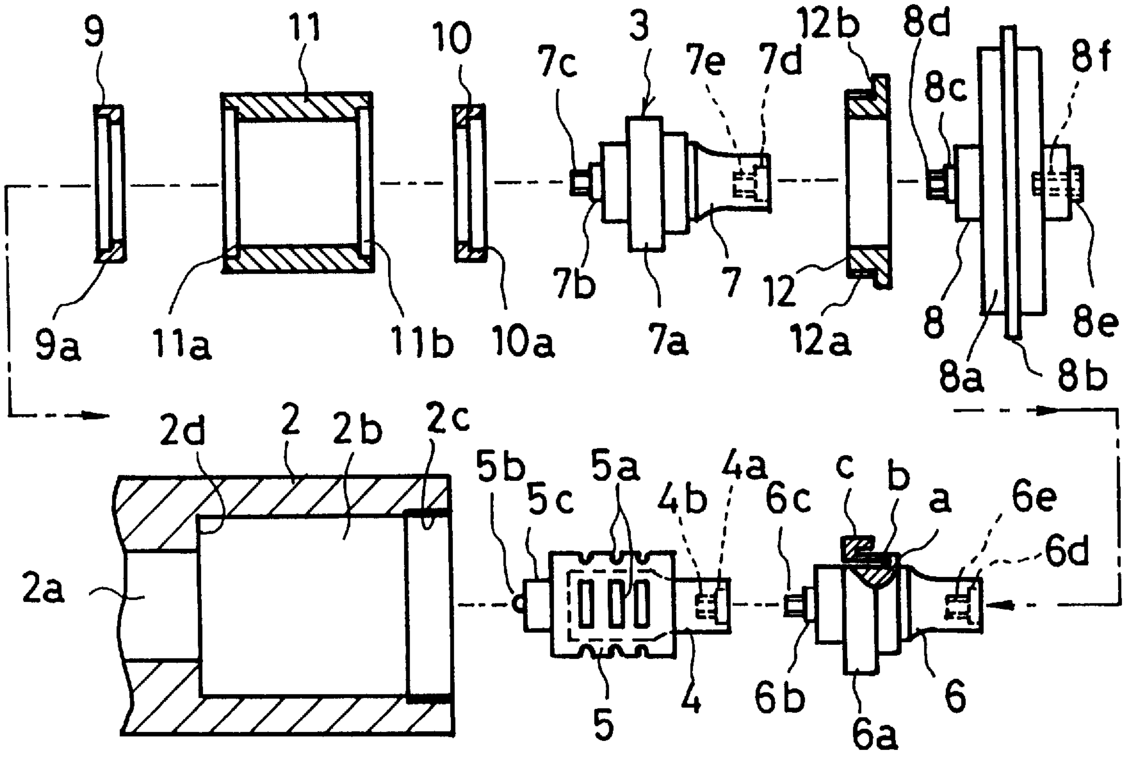
FIG. 1*a* is an exploded view and FIG. 1*b* is a sectional view of an assembly.
Figure 1B:
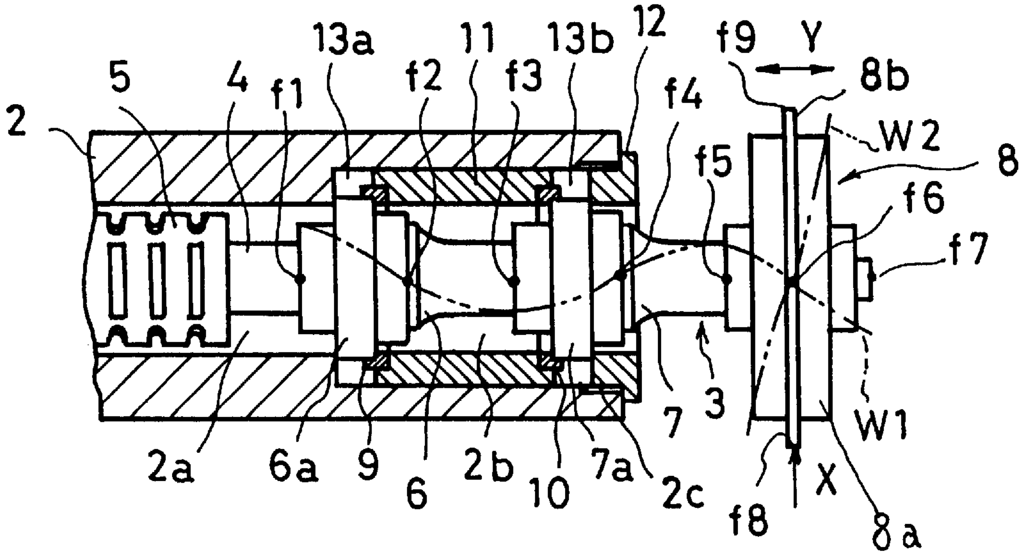
Figure 2:
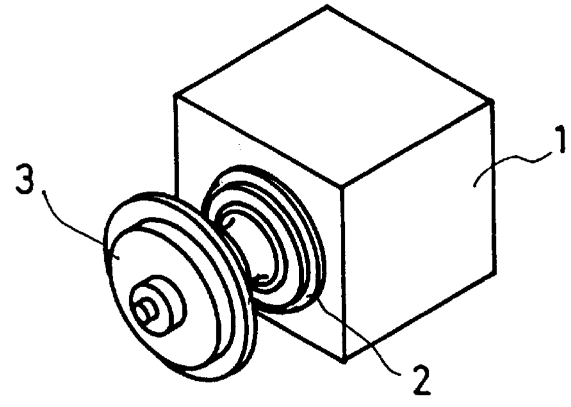
FIG. 2 is a perspective view of the first embodiment.

FIGS. 1 and 2 show a first embodiment of the present invention. As shown in FIG. 2, this embodiment is characterized in that a resonator 3 is attached to a cylindrical holder 2 rotatably installed in a main body 1 of an ultrasonic vibration bonding machine in such a manner that it is supported at one side.

In this embodiment, as shown in FIG. 1*a*, the holder 2 has a transducer storage chamber 2*a* at the center thereof, a booster storage chamber 2*b* having a diameter larger than that of the transducer storage chamber 2*a* and a threaded hole 2*c* which are continuously formed coaxially from an interior side to one end side thereof. The threaded hole 2*c* is formed by threading the interior wall on a side where the booster storage chamber 2*b* is open at one end of the holder 2.

A transducer 4 is an electro-acoustic converter or electric-vibration converter which is formed of a piezoelectric or magnetorestrictive element for converting electric energy into mechanical energy which outputs and generates the ultrasonic vibration of a vertical wave having a predetermined frequency with power supplied from an unshown ultrasonic generator. A recess portion 4*a* and a threaded hole 4*b* are formed coaxially in an output end of the transducer 4. A cover 5 having a large number of radiation holes 5*a* formed in the cylindrical exterior wall made from a metal having high heat conductivity and electric conductivity, such as aluminum, is fitted onto the transducer 4. Two wires, not shown, of the transducer 4 which receive power from the ultrasonic generator are individually connected to two respective electric contact points 5*b* and 5*c* which are formed at the bottom of the cover 5 in such a manner that they are electrically insulated from each other.

The resonator 3 resonates with ultrasonic vibration transmitted from the transducer 4 and comprises a rod-shaped first booster 6 made from a material selected from titanium, aluminum and hardened iron, a rod-shaped second booster 7 made from the same material as the first booster 6, and a rod-shaped ultrasonic horn 8 made from an alloy such as a titanium alloy.

The first booster 6 and the second booster 7 are made from the same material and have the same shape. The first booster 6 is connected to the transducer 4 and the second booster 7 is connected to the first booster 6. The first and second boosters 6 and 7 have a length equal to half the wavelength from the maximum vibration amplitude point to the next maximum vibration amplitude point, comprise ring-shaped support portions 6*a* and 7*a* as a projecting portion which consists of a thick root portion a, a thin intermediate portion b and a thick end portion c and projects outward from all the exterior surface of the minimum vibration amplitude point located between the above maximum vibration amplitude points, and have projecting portions 6*b* and 7*b* and headless screws 6*c* and 7*c* which are formed coaxially with the projecting portions 6*b* and 7*b* and fitted into unshown threaded holes at one ends thereof and recess portions 6*d* and 7*d* and threaded holes 6*e* and 7*e* which are formed coaxially with the recess portions 6*d* and 7*d* at the other ends thereof, respectively.

The ultrasonic horn 8 has a length equal to half the wavelength from the maximum vibration amplitude point to the next maximum vibration amplitude point, comprises a disk-shaped vibration direction changing portion 8*a* projecting from all the exterior surface of the minimum vibration amplitude point located between the above maximum vibration amplitude points and a narrow ring-shaped bonding working portion 8*b* on the exterior surface thereof at the maximum vibration amplitude point of the vibration direction changing portion 8*a*, and has a projecting portion 8*c* and a headless screw 8*d* which is formed coaxially with the projecting portion 8*c* and fitted into an unshown threaded hole at one end thereof and a projecting portion 8*e* and a threaded hole 8*e* which is formed coaxially with the projecting portion 8*e* at the other end thereof.

First and second spacers 9 and 10 are made from the same material such as a thermosetting synthetic resin and have the same shape. The first spacer 9 is arranged on the first booster 6 side and the second spacer 10 is arranged on the second booster 7 side to face a direction opposite to that of the first spacer 9. The first and second spacers 9 and 10 are ring-shaped with an outer diameter smaller than the inner diameter of the booster storage chamber 2*b* of the holder 2 and an inner diameter larger than the outer diameter near the support portions 6*a* and 7*a* of the first and second boosters 6 and 7, and comprise stepped portions 9*a* and 10*a* for accepting the outer peripheral edges of the end portions c of the support portions 6*a* and 7*a* of the first and second boosters 6 and 8 on one end surfaces thereof, respectively.

A collar 11 which is a bridge member is cylindrical with an outer diameter to be inscribed in the booster storage chamber 2*b* of the holder 2 and an inner diameter larger than the outer diameter of the intermediate portions b of the support portions 6*a* and 7*a* of the first and second boosters 6 and 7, and comprises storage portions 11*a* and 11*b* for storing the first and second spacers 9 and 10 coaxially on both end surfaces thereof. When the first and second spacers 9 and 10 are stored in the storage portions 11*a* and 11*b* of the collar 1, the distance from the stepped portion 9*a* of the first spacer 9 to the stepped portion 10*a* of the second spacer 10 is made equal to the distance from the end portion c of the support portion 6*a* to the end portion c of the support portion 7*a* when the first and second boosters 6 and 7 are connected coaxially with each other by screwing the headless screw 7*c* projecting from the second booster 7 into the threaded hole 6*e* of the first booster 6.

A stopper 12 is ring-shaped with an inner diameter larger than the outer diameter of the intermediate portion b of the support portion 7*a* of the second booster 7, and has a male screw portion 12*a* to be fitted into the threaded hole 2*c* of the holder 2 formed on the outer peripheral surface thereof and a flange 12*b* projecting outward from one end of the screw portion 12*a*.

As shown in FIG. 1*b*, to make the holder 2 to support the resonator 3, the headless screw 6*c* of the first booster 6 is first screwed into the threaded hole 4*b* of the transducer 4, whereby the projecting portion 6*b* of the first booster 6 is fitted into the recess portion 4*a* of the transducer 4 and the first booster 6 is connected to the output end of the transducer 4 coaxially.

Thereafter, the first spacer 9 is fitted onto the first booster 6 from a side opposite to the transducer 4 in such a manner that the stepped portion 9*a* of the first spacer 9 is fitted onto the end portion c of the support portion 6*a* to fit the first spacer 9 into the support portion 6*a* of the first booster 6 coaxially. Like the first spacer 9, the collar 11 is fitted onto the first booster 6 from a side opposite to the transducer 4 and the first spacer 9 is fitted into the storage portion 11*a* on a top end side in a fitting direction of the collar 11. After the second spacer 10 is fitted into the other storage portion 11*b* of the collar 11, the headless screw 7*c* of the second booster 7 is screwed into the threaded hole 6*e* of the first booster 6 through the collar 11 and the second spacer 10. Thereby, the projecting portion 7*b* of the second booster 7 is fitted into the recess portion 6*d* of the first booster 6, the end portion c of the support portion 7*a* of the second booster 7 is fitted onto the stepped portion 10*a* of the second spacer 10, the first spacer 9, the collar 11 and the second spacer 10 are interposed between the support portion 6*a* of the first booster 6 and the support portion 7*a* of the second booster 7, and the first booster 6 and the second booster 7 are connected coaxially with each other.

Thereafter, the transducer 4 is inserted into the transducer storage chamber 2*a* through the booster storage chamber 2*b* from the threaded hole 2*c* of the holder 2, the collar 11 is inserted into the booster storage chamber 2*b*, the stopper 12 is fitted onto the second booster 7, and the male screw portion 12*a* of the stopper 12 is screwed into the threaded hole 2*c* of the holder 2. Thereby, the stopper 12 presses the end portion c of the support portion 7*a* of the second booster 7 in an axial direction, the end portion c of the support portion 6*a* of the first booster 6 contacts the stepped portion 2*d* as a stopper of the holder 2, and the support portions 6*a* and 7*a* of the first and second boosters 6 and 7 are firmly connected to each other in such a manner that they are held by the stopper 12, the stepped portion 2*d* of the holder 2, the collar 11, the first spacer 9 and the second spacer 10 in the axial direction.

Finally, the ultrasonic horn 8 is connected to the second booster 7 projecting outward from the stopper 12 coaxially by means of the headless screw 8*d* and the threaded hole 7*e*, whereby the projecting portion 8*c* of the ultrasonic horn 8 is fitted into the recess portion 7*d* of the second booster 7, and the resonator 3 consisting of the first booster 6, the second booster 7 and the ultrasonic horn 8 is firmly supported by the holder 2.

According to the constitution of this embodiment, ultrasonic vibration from the transducer 4 is transmitted to the ultrasonic horn 8 through the first booster 6 and the second booster 7 and the bonding working portion 8*b* of the ultrasonic horn 8 is pressed against a workpiece, for example, an overlapped portion of a plurality of unshown metal members to join the overlapped portion. At this point, the ultrasonic horn 8 receives force perpendicular to an axial direction as shown by an arrow X in FIG. 1*b* from the workpiece. Since the cylindrical member which consists of the collar 11, the first spacer 9 and the second spacer 10 is interposed between the support portion 6*a* of the first booster 6 and the support portion 7*a* of the second booster 7 and the collar 11 is fitted in and inscribed in the booster storage chamber 2*b* of the holder 2, such inconvenience that a portion between the support portion 6*a* of the first booster 6 and the support portion 7*a* of the second booster 7 is curved is eliminated. Even when the stopper 12 is strongly fastened to attach the resonator 3 to the holder 2, such inconvenience that a portion between the support portion 6*a* of the first booster 6 and the support portion 7*a* of the second booster 7 is curved such that they approach each other can be prevented. Therefore, ultrasonic vibration energy can be properly transmitted from the transducer 4 to the ultrasonic horn 8. Further, the bonding working portion 8*b* of the ultrasonic horn 8 can be located accurately and contacted to the workpiece precisely, a loss of ultrasonic vibration energy can be reduced, and reliability in quality can be improved.

In addition, since the collar 11 having an outer diameter larger than the support portions 6*a* and 7*a* of the first and second boosters 6 and 7 is fitted in and inscribed in the booster storage chamber 2*b* of the holder 2, spaces 13*a* and 13*b* are formed between the interior peripheral surface forming the booster storage chamber 2*b* of the holder 2 and the support portions 6*a* and 7*a* of the first and second boosters 6 and 7 while the first and second boosters 6 and 7 interconnected coaxially with the cylindrical member consisting of the collar 11 and the first and second spacers 9 and 10 interposed therebetween are installed in the booster storage chamber 2*b* of the holder 2, whereby the support portions 6*a* and 7*a* of the first and second boosters 6 and 7 can be firmly interconnected with a small contact area to ensure that they are not curved, and a loss of ultrasonic vibration energy transmitted from the transducer 4 to the ultrasonic horn 8 can be reduced.

Figure 3:
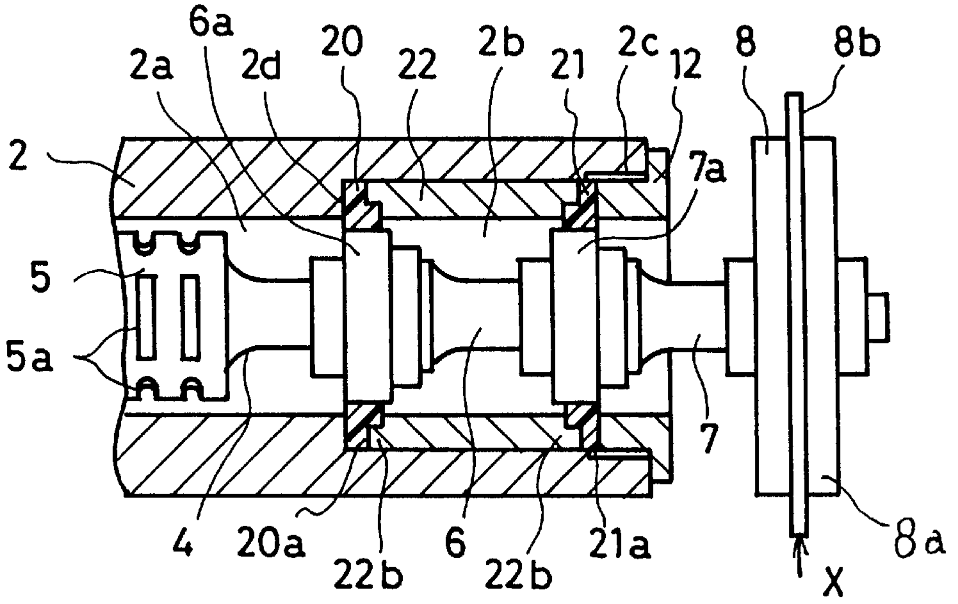
FIG. 3 is a sectional view of a second embodiment of the present invention.
Figure 4:
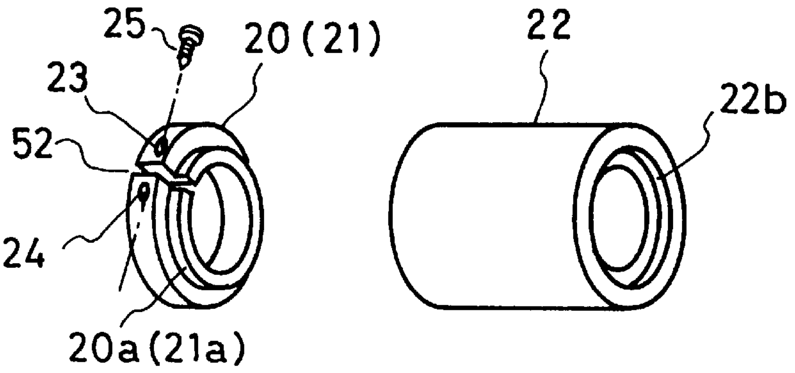
FIG. 4 is a perspective view showing the spacer and the collar of the second embodiment.

FIGS. 3 and 4 show a second embodiment of the present invention. As shown in FIG. 3, this embodiment is characterized in that the first and second boosters 6 and 7 are interconnected coaxially, first and second spacers 20 and 21 are fitted onto the support portions 6*a* and 7*a* of the first and second boosters 6 and 7, respectively, a collar 22 is interposed between the first and second spacers 20 and 21, the stopper 12 is screwed into the threaded hole 2*c* of the holder 2 so that the stopper 12 presses the second spacer 21, the first spacer 20 contacts the stepped portion 2*d* of the holder 2 through the collar 22 between it and the second spacer 21, and the first and second boosters 6 and 7 are firmly connected to the holder 2.

The first and second spacers 20 and 21 are made from the same material such as a thermosetting synthetic resin and have the same shape. The first spacer 20 is arranged on the first booster 6 side and the second spacer 21 is arranged on the second booster 7 side to face a direction opposite to that of the first spacer 20. The first and second spacers 20 and 21 are ring-shaped with an outer diameter equal to the inner diameter of the booster storage chamber 2*b* of the holder 2 and an inner diameter slightly smaller than the outer diameters of the support portions 6*a* and 7*a* of the first and second boosters 6 and 7 and have a single slit 52 therein. A through hole 23 is formed in one separated portion and a threaded hole 24 is formed in the other separated portion at a position corresponding to the through hole 23. Stepped portions 20*a* and 21*a* are formed like a coaxial ring on one end surfaces of the first and second spacers 20 and 21, respectively.

The collar 22 is cylindrical with an outer diameter equal to the inner diameter of the booster storage chamber 2*b* of the holder 2 and an inner diameter larger than the outer diameters of the end portions c of the support portions 6*a* and 7*a* of the first and second boosters 6 and 7 and have on both end surfaces storage portions 22*a* and 22*b* for storing the stepped portions 20*a* and 21*a* of the first and second spacers 20 and 21 in such a manner that they face each other and are coaxial with each other, respectively.

In this embodiment, to make the holder 2 to support the resonator 3, the stepped portions 20*a* and 21*a* of the first and second spacers 20 and 21 which are open outward by the formation of the slit 52 are individually fitted into the storage portions 22*a* and 22*b* of the collar 22, respectively, Meanwhile, the first and second boosters 6 and 7 are interconnected coaxially, the support portion 7*a* of the second booster 7 is located within the second spacer 21 from the first spacer 20 through the collar 22, for example, the support portion 6*a* of the first booster 6 is located within the first spacer 20, and then screws 25 shown in FIG. 4 are screwed into the threaded holes 24 through the slits 52 from the through holes 23 of the first and second spacers 20 and 21 to fix the first and second spacers 20 and 21 to the support portions 6*a* and 7*a* of the first and second boosters 6 and 7, respectively. The transducer 5 is connected to the first booster 6 coaxially, the ultrasonic horn 8 is connected to the second booster 7 coaxially, the transducer 4 is inserted into the transducer storage chamber 2*a* through the booster storage chamber 2*b* from the threaded hole 2*c* of the holder 2, the collar 22 is inserted into the booster storage chamber 2*b*, the stopper 12 is fitted onto the second booster 7, and the male screw portion 12*a* of the stopper 12 is screwed into the threaded hole 2*c* of the holder 2. Thereby, the stopper 12 presses the second spacer 21 fixed to the support portion 7*a* of the second booster 7 in an axial direction, the first spacer 20 fixed to the support portion 6*a* of the first booster 6 contacts the stepped portion 2*d* of the holder 2, the stopper 12 and the stepped portion 2*d* of the holder 2 connect the first and second spacers 20 and 21 firmly in such a manner that they sandwich the first and second spacers 20 and 21 with the collar 22 therebetween in the axial direction, and thereby the first and second boosters 6 and 7 are firmly held by the holder 2.

According to the constitution of this embodiment, ultrasonic vibration from the transducer 4 is transmitted to the ultrasonic horn 8 through the first booster 6 and the second booster 7, the bonding working portion 8*b* of the ultrasonic horn 8 is pressed against a workpiece, for example, an overlapped portion of a plurality of unshown metal members to join the overlapped portion. At this point, the ultrasonic horn 8 receives force perpendicular to the axial direction as shown by an arrow X in FIG. 3 from the workpiece. Since a cylindrical member which is the collar 11 is interposed between the first spacer 20 and the second spacer 21 fixed to the support portion 6*a* of the first booster 6 and the support portion 7*a* of the second booster 7 and the collar 11 is fitted in the booster storage chamber 2*b* of the holder 2, such inconvenience that a portion between the support portion 6*a* of the first booster 6 and the support portion 7*a* of the second booster 7 is curved is eliminated. Even when the stopper 12 is strongly fastened to attach the resonator 3 to the holder 2, such inconvenience that the portion between the support portion 6*a* of the first booster 6 and the support portion 7*a* of the second booster 7 is curved in such a manner that they approach each other can be prevented. Therefore, ultrasonic vibration energy can be properly transmitted from the transducer 4 to the ultrasonic horn 8 and the bonding working portion 8*b* of the ultrasonic horn 8 can be located and contacted to the workpiece precisely, thereby making it possible to reduce a loss of ultrasonic vibration energy and improve reliability in quality.

Figure 5:
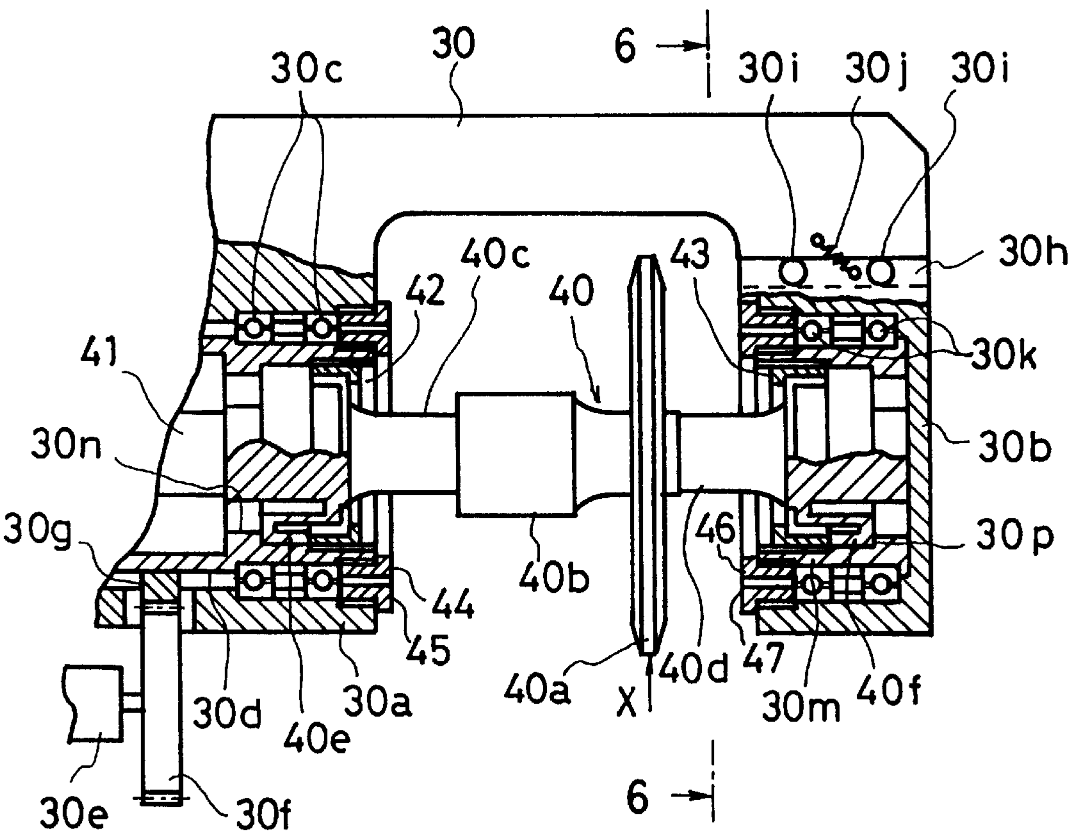
FIG. 5 is a partially cutaway side view of a third embodiment of the present invention.
Figure 6:
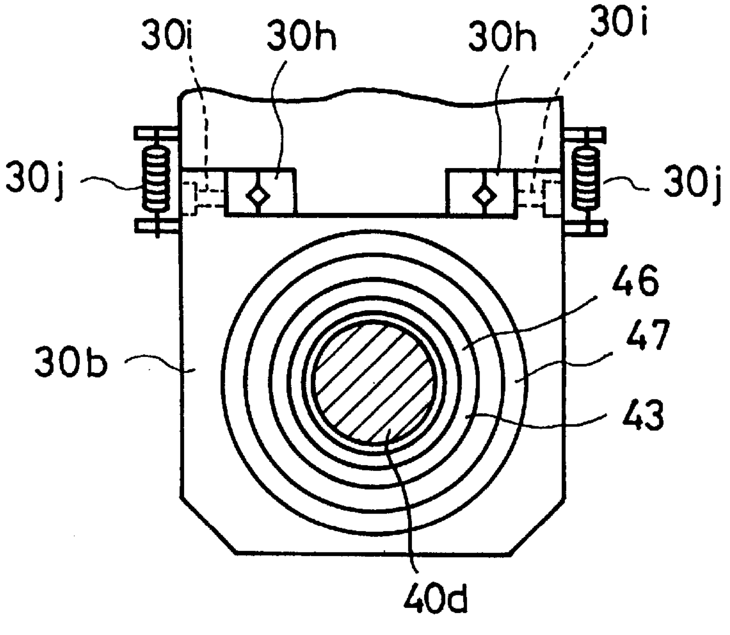
FIG. 6 is a sectional view cut on line A—A of FIG. 5.

FIGS. 5 and 6 show a third embodiment of the present invention. A resonator 40 is attached to the holder 30 of an ultrasonic bonding machine in such a manner that it is supported at both sides and the holder 30 comprises opposing arms 30*a* and 30*b*. The arm 30*a* has a rotary cylinder 30*d* rotatably installed therein through a bearing 30*c*. The rotary cylinder 30*d* is driven to rotate by a motor 30*e* installed external to the holder 30 through a drive gear 30*f* and a ring-shaped driven gear 30*g* engaged with the drive gear 30*f*. The other arm 30*b* is formed like a block movably installed on a base portion of the holder 30 through a guide rail 30*h* such as a cross roller and a play at the guide rail 30*h* produced when the arm 30*b* moves is removed and the arm 30*b* is caused to stand firm at the time of joining by adjusting an extra pressure adjusting bolt 30*i*. The arm 30*b* is urged toward the arm 30*a* by a spring 30*j* provided between the base portion of the holder 30 and the arm 30*b*. The arm 30*b* has a rotary cylinder 30*m* rotatably installed therein through a bearing 30*k*.

The resonator 40 is constructed by connecting first and second boosters 40*c* and 40*d* to both sides of an ultrasonic horn 40*b* having a disk-shaped bonding working portion 40*a* by means of unshown headless screws and threaded holes. The output end of a transducer 41 is coaxially connected to the first booster 40*c* by unshown headless screws and threaded holes.

The resonator 40 including the transducer 41 is attached to the holder 30 in the following manner, for example. The transducer 41 and the first booster 40*c* are first connected to each other, a stopper 42 is fitted onto the first booster 40*c* on a side opposite to the side where the transducer 41 is connected, and the ultrasonic horn 40*b* is connected to the first booster 40*c*. Thereafter, since the total length in an axial direction of an assembly of the transducer 41, the first booster 40*c* and the ultrasonic horn 40*b* is larger than the interval between the arm 30*a* and the arm 30*b*, the arm 30*b* is shifted away from the arm 30*a* to store the transducer 41 and the first booster 40*c* within the arm 30*a*. At the same time, the second booster 40*d* is stored within the arm 30*b*. The first booster 40*c* may be first stored within the arm 30*a*, or the second booster 40*d* may be first stored within the arm 30*b*. In short, the assembly of the transducer 41, the first booster 40*c* and the ultrasonic horn 40*c* is stored within the arm 30*a* by shifting the arm 30*b*, the second booster 40*d* is stored within the arm 30*b*, and a stopper 43 other than the above stopper 42 is fitted onto the second booster 40*d* projecting from the arm 30*b*. Thereafter, the second booster 40*d* and the ultrasonic horn 40*b* are connected to each other, the stopper 42 is screwed into the arm 30*a* and a support portion 40*e* projecting outward concentrically from the first booster 40*c* is sandwiched between the stopper 42 and a stepped portion 30*n* of the arm 30*a* to fix the first booster 40*c* to the rotary cylinder 30*d* of the arm 30*a*. The stopper 43 is screwed into the arm 30*b* and a support portion 40*f* projecting outward concentrically from the second booster 40*d* is sandwiched between the stopper 43 and a stepped portion 30*p* of the arm 30*b* to fix the second booster 40*d* to the rotary cylinder 30*m* of the arm 30*b*.

In this embodiment, the first booster 40*c* may be first fixed to the rotary cylinder 30*d*, or the second booster 40*d* may be first fixed to the rotary cylinder 30*m*. Since the arm 30*b* is movably attached to the holder 30, when the resonator 40 connected to the transducer 41 is to be fixed to the rotary cylinders 30*d* and 30*m* by the stoppers 42 and 43, the arm 30*b* moves away from the arm 30*a* and the resonator 40 is properly supported by the holder 30 at both sides.

According to the constitution of this embodiment, the resonator 40 is driven to rotate by the motor 30*e*, ultrasonic vibration from the transducer 41 is transmitted to the ultrasonic horn 40*b* through the first booster 40*c*, and the bonding working portion 40*a* of the resonator 40 is pressed against a workpiece, for example, an overlapped portion of a plurality of unshown metal members to join the overlapped portion while it rotates. At this point, the ultrasonic horn 40*b* receives force perpendicular to the axial direction as shown by an arrow X in FIG. 5 from the workpiece. Since the resonator 40 is attached to the holder 30 in such a manner that it is supported at both sides, such inconvenience that a portion between the support portion 40*e* of the first booster 40*c* and the support portion 40*f* of the second booster 40*d* is curved is eliminated. Even when the stoppers 42 and 43 are strongly fastened to attach the resonator 40 to the holder 2, the support portions 40*e* and 40*f* of the first and second boosters 40*c* and 40*d* are sandwiched between the stepped portions 30*n* and 30*p* of the holder 30 and the stoppers 42 and 43 in an axial direction, respectively, and such inconvenience that the portion between the support portions 40*e* and 40*f* of the first and second boosters 40*c* and 40*d* is curved in such a manner that they approach each other can also be prevented. Therefore, ultrasonic vibration energy can be properly transmitted from the transducer 41 to the ultrasonic horn 40*b* and the bonding working portion 40*a* of the resonator 40 can be located and contacted to the workpiece precisely, thereby making it possible to reduce a loss of ultrasonic vibration energy and improve reliability in quality.

In the first and second embodiments, the first spacer 9 or 20 and the second spacer 10 or 21 are formed from a thermosetting synthetic resin, and the first spacer 9 or 20 and the second spacer 10 or 21 are prevented from being joined to the metal collar 11 or 22 with ultrasonic vibration leaked from the support portions 6*a* and 7*a* of the first and second boosters 6 and 7. When the vibration of the resonator 3 is properly adjusted to prevent ultrasonic vibration from leaking from the support portions 6*a* and 7*a* of the first and second boosters 6 and 7, the same effect can be obtained even if the first spacer 9 or 20 and the second spacer 10 or 21 are formed from a metal or the boosters are directly installed in the collar 11 or 22 without the metal spacers.

In the third embodiment, the resonator 40 is driven to rotate by the motor 30*e*. The same effect can be obtained when the resonator 40 is rotatably attached to the holder 30, the bonding working portion 40*a* of the resonator 40 is brought into contact with a workpiece, and the holder 40 is moved in a direction perpendicular to the plane of the sheet of FIG. 5 to rotate the resonator 40.

A reference symbol W1 in FIG. 1*b* represents a waveform showing an instantaneous displacement of ultrasonic vibration caused by the resonance of the resonator 3, W2 a waveform showing an instantaneous displacement of ultrasonic vibration whose transmission direction is changed by the ultrasonic horn 8, f1, f3, f5 and f7 the maximum vibration amplitude points of the waveform W1, f2, f4 and f6 the minimum vibration amplitude points of the waveform W1, f8 and f9 the maximum vibration amplitude points of the waveform W2, and Y the vibration direction of the bonding working portion 8*b*.

A reference numeral 44 in FIGS. 5 and 6 denotes an inner fixing tool for fixing the inner sleeve of the bearing 30*c* to the rotary cylinder 30*d*, 45 an outer fixing tool for fixing the outer sleeve of the bearing 30*c* to the arm 30*a*, 46 an inner fixing tool for fixing the inner sleeve of the bearing 30*k* to the rotary cylinder 30*m* and 47 an outer fixing tool for fixing the outer sleeve of the bearing 30*k* to the arm 30*b*.

What is claimed is:

1. A support unit for an ultrasonic vibration resonator, comprising:

a cylindrical holder having a transducer storage chamber and a booster storage chamber having a diameter greater than that of said transducer storage chamber, forming a stepped portion between these chambers and an opening at an opposite end of said booster storage chamber;

a transducer provided in said transducer storage chamber;

a first booster connected to said transducer and having a first circular support portion abutted against said stepped portion;

a second booster connected to said first booster and having a second circular support portion;

a cylindrical collar inscribed in said booster storage chamber and having a pair of first and second circular stepped portions at opposite ends abutted against said first and second circular support portions; and a circular stopper attached to said opening so that said first and second circular support portions are held between said stepped portion and said first circular stepped portion and between said second circular stepped portion and said circular stopper, respectively.

2. A support unit according to claim 1, which further comprises a pair of first and second annular spacers held between said first and second circular support portions via said cylindrical collar inscribed in said booster storage chamber.

3. A support unit according to claim 1, which further comprises a pair of first and second annular spacers attached to said first and second circular supports, respectively, and held in said booster storage chamber between said stepped portion and said first circular stepped portion and between said second circular stepped portion and said circular stopper, respectively.

4. A support unit according to claim 3, wherein said annular spacers each have a slit and a screw for attaching said annular spacers to said circular supports, respectively.

5. A support unit for an ultrasonic vibration resonator, comprising:

a holder having a holder body and a pair of first and second arms having a pair of first and second openings at opposed faces and a pair of stepped portions at positions away from said opposed faces;

a pair of first and second boosters having ring-like supports respectively; and a pair of first and second circular stoppers attached to said first and second openings so that said ring-like supports are held between said first circular stepped portion and said first circular stopper and between said second circular stepped portion and said second circular stopper.

6. A support unit according to claim 5, which further comprises a pair of first and second rotary cylinders provided in said first and second arms, respectively, to accommodate said first and second openings and first and second circular stepped portions.

7. A support unit according to claim 6, which further comprises a motor for rotating said rotary cylinders.

8. A support unit according to claim 5, which further comprises a pair of guide rails provided on said holder body to which said second arm is attached for sliding movement in an axial direction of said holder body.

9. A support unit according to claim 8, which further comprises a pair of springs for biasing said second arm toward said first arm.

* * * * *